(12) United States Patent
Loughmiller

(10) Patent No.: US 6,836,419 B2
(45) Date of Patent: Dec. 28, 2004

(54) SPLIT WORD LINE TERNARY CAM ARCHITECTURE

(75) Inventor: Daniel R. Loughmiller, Boise, ID (US)

(73) Assignee: Micron Technology, Inc., Boise, ID (US)

(*) Notice: Subject to any disclaimer, the term of this patent is extended or adjusted under 35 U.S.C. 154(b) by 147 days.

(21) Appl. No.: 10/226,339

(22) Filed: Aug. 23, 2002

(65) Prior Publication Data

US 2004/0037103 A1 Feb. 26, 2004

(51) Int. Cl.[7] .................. G11C 15/00; G11C 11/24
(52) U.S. Cl. .................................. 365/49; 365/149
(58) Field of Search ...................... 365/49, 149, 156, 365/188, 189.07

(56) References Cited

U.S. PATENT DOCUMENTS 5,930,161 A * 7/1999 Sheikholeslami et al. ...... 365/49
6,262,907 B1 * 7/2001 Lien et al. .................. 365/49
6,310,880 B1 * 10/2001 Waller ....................... 370/400
6,320,777 B1   11/2001 Lines et al. ................ 365/49
6,430,073 B1 * 8/2002 Batson et al. .............. 365/49

* cited by examiner

Primary Examiner—Anh Phung
(74) Attorney, Agent, or Firm—Dickstein Shapiro Morin & Oshinsky LLP (57) ABSTRACT

A content addressable memory (CAM) cell which has a split word line scheme and having binary and ternary storage capability. The cell has a pair of storage devices, a comparing circuit, a pair of memory access devices having gates controlled by respective word lines, a pair of bit lines for writing to and reading from the storage devices, or pair of search lines. Furthermore, the dynamic CAM cell utilizes a folded bit line architecture with a single sense amplifier sensing inputs from the pair of bit lines.

67 Claims, 9 Drawing Sheets

SPLIT WORD LINE TERNARY CAM ARCHITECTURE

FIELD OF THE INVENTION

The present invention relates to content addressable memory (CAM). More specifically, the present invention relates to a ternary CAM architecture implementing a split word line scheme and a folded bit line architecture.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data being stored within a given memory location) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., random access memory (RAM), dynamic RAM (DRAM), etc.). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has a pair of status bits that keep track of whether the location is storing valid information in it or is empty and available for writing.

Once information is stored in a memory location, it is found by comparing every bit in memory with data placed in a match detection circuit. When the content stored in the CAM memory location does not match the data placed in the match detection circuit, the CAM device returns a no match indication. When the content stored in the CAM memory location matches the data placed in the match detection circuit, the CAM device returns a match indication. In addition, the CAM may return the identification of the address location in which the desired data is stored. Thus, with a CAM, the user supplies the data and gets back the address if there is a match found in memory.

Generally, CAM includes an array of CAM cells arranged in row and column lines. Each CAM cell stores one bit of digital data and includes a circuit to allow comparing the stored data with the externally provided search data. One or more bits of information in a row constitute a word. A CAM compares a search word with a row of words stored within the CAM. During a search and compare operation, an indicator associated with each stored word produces a comparison result indicating whether or not the search word matches the stored word.

The CAM structure can be made more powerful and useful by incorporating additional logic whereby a "don't care" state can be presented in addition to the "0" state and "1" state. A "don't care" state can be stored which allows certain bits of data to be skipped from search operations. The "don't care" state can be stored by having similar charges on the two storage capacitors. In addition, additional flexibility results from the ability to store the "don't care" state in the memory itself. The use of the "don't care" state means that the CAM device has "ternary" storage capabilities.

Some of the prior art CAM cells use static storage while others use a dynamic storage element. Dynamic storage elements occupy a smaller area and are therefore preferable to obtain a large memory capacity on a single integrated circuit chip. In addition, a dynamic storage cell is more efficient for ternary storage as described above.

A dynamic CAM is cell suitable for constructing relatively high-speed and large capacity CAM arrays, having binary and ternary storage capacity. Furthermore, the CAM cell also provides a relatively stable voltage level at the match line and a relatively stable capacitance at the bit lines.

Figure 1:
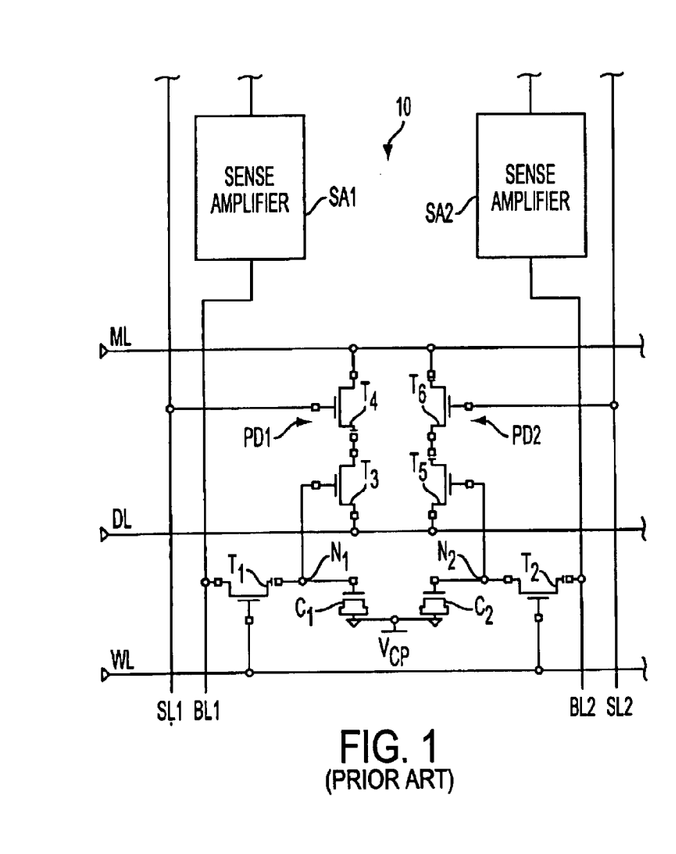
FIG. 1 illustrates a circuit diagram of a conventional dynamic CAM cell.

A conventional CAM cell 10 is illustrated in FIG. 1. As shown in this figure, the CAM cell 10 includes first and second storage device(s) C1, C2 in the form of capacitors. Each storage device C1, C2 is capable of storing a charge representing a binary '1' or a '0'. In a binary configuration, the CAM cell 10 stores a binary bit of digital information as '0' on C1 and '1' on C2 or '1' on C1 and '0' on C2. Furthermore, in a ternary configuration, the CAM cell 10 attains an additional "don't care" state when both storage devices C1, C2 store a '0'. Further shown in FIG. 1 are the first and second cell nodes N1, N2 which carry signal levels corresponding to the data stored in the CAM cell 10. The two cell nodes N1, N2 are accessible for write and read operations via first and second access transistors T1, T2, respectively. The remaining two terminals of the storage device C1, C2 are connected to the cell plate voltage terminal $V_{CP}$. The source terminals of the access transistors T1, T2 are connected to the nodes N1, N2 whereas their drain terminals are connected to the first and second bit lines BL1, BL2. The first and second access transistors T1, T2 are responsive to and have their gate terminals connected to a word line WL.

Also shown in FIG. 1 is a comparing circuit having first and second pull-down circuits PD1, PD2. The first pull-down circuit PD1 consists of third and fourth pull-down transistors T3, T4 respectively connected in series between a match line ML and a discharge line DL. The drain terminal of the third pull-down transistor T3 is connected to the source terminal of the fourth pull-down transistor T4. The third pull-down transistor T3 is responsive to the first cell node N1 by having its gate connected to node N1. The gate of the fourth pull down transistor T4 is connected to a first search line SL1. Similarly, the second pull-down circuit PD2 consists of fifth and sixth pull-down transistors T5, T6 respectively connected between the match line ML and the discharge line DL. The drain terminal of the fifth pull-down transistor T5 is connected to the source terminal of the sixth pull-down transistor T6. The gate terminal of the fifth pull-down transistor T5 is connected to the second node N2 and the gate of the sixth pull-down transistor T6 is connected to a second search line SL2. The combination of the first and second pull-down circuits PD1, PD2 provides a comparison between complementary data bits stored in the storage devices C1, C2 and complementary search bits carried on SL1 and SL2. The result of such comparison is reflected in the match line ML being discharged by the first or the second pull-down circuit PD1, PD2 if there is a data mismatch (as will be further described below).

A CAM device performs three distinct operations, a write operation, read operation and search and compare operation. The conventional CAM cell 10 has two storage devices C1, C2 for storing two data bits which have independent values from each other. The storage devices C1, C2 are each connected to bit lines BL1, BL2 through access transistors T1, T2, respectively. The bit lines BL1, BL2 allow for data to be independently written to the corresponding storage devices C1, C2. The two search lines SL1, SL2 connected to the pull-down circuits PD1, PD2 are used for distinct search and compare operations. A search operation consists of comparing the search bits carried on the search lines SL1, SL2 to data bits stored in the first and second storage devices C1, C2. The comparing circuit couples the match line ML to the discharge line DL if a mismatch occurs between the first and second search bits and the respective first and second data bits, and when the first and second data bits have complementary values.

Furthermore, FIG. 1 discloses a CAM cell 10 with an open bit line architecture. Each bit line shown in FIG. 1 of the conventional CAM cell 10 is connected to a separate sense amplifier SA1, SA2. Furthermore, each storage device C1, C2 is coupled to respective bit lines by access transistors T1, T2 which have their gates connected to the same word line WL. The circuit in FIG. 1 has a sense amplifier for each bit line in the CAM array architecture.

SUMMARY OF THE INVENTION

The present invention provides a ternary CAM architecture which implements a split word line scheme and a folded bit line architecture. The split word line scheme and folded bit line array architecture provides improved noise immunity and consistency with commodity DRAM architectures. Furthermore, the present invention reduces the high sense amplifier count typically associated with a ternary CAM memory array.

In accordance with an aspect of the present invention, there is provided a CAM cell for storing and accessing ternary data which comprises a split word line scheme. The present invention reduces the number of sense amplifiers by at least half by allowing one sense amplifier to sense the data from multiple storage devices. This is accomplished by using a split word line to access the storage devices independently of each other as well as improving the sensed signal in array CAMs by reducing noise.

The foregoing and other advantages and features of the invention will become more apparent from the following detailed description of exemplary embodiments provided below with reference to the accompanying drawings in which:

DETAILED DESCRIPTION OF THE INVENTION

Figure 2:
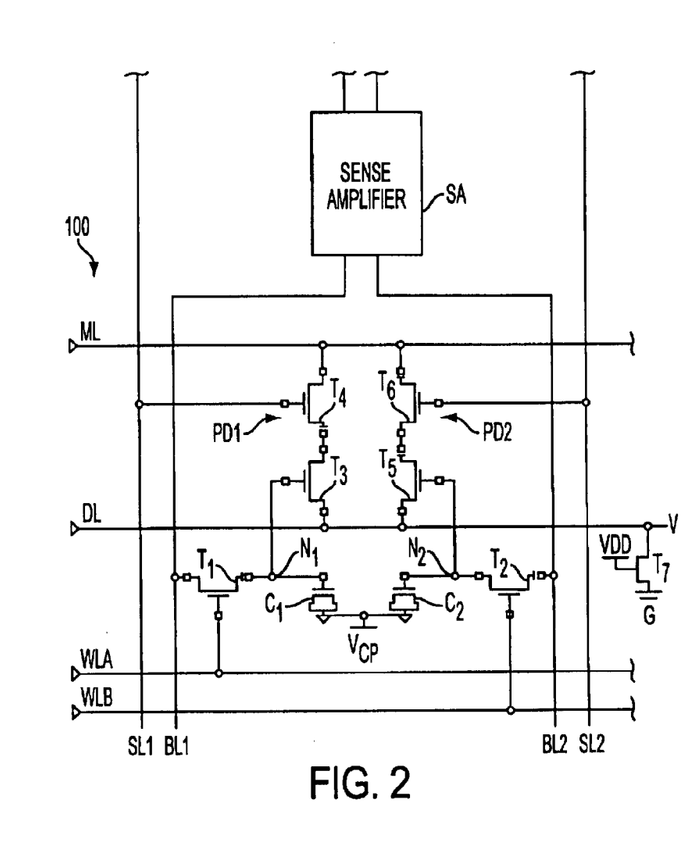
FIG. 2 illustrates a circuit diagram of a dynamic CAM cell according to an embodiment of the present invention.

A dynamic CAM cell 100 in accordance with an embodiment of the present invention is illustrated in FIG. 2. The CAM cell 100 includes first and second storage devices C1, C2 in the form of capacitors. Each storage device C1, C2 is capable of storing a '1' or a '0' value. A '1' value corresponds to a stored voltage in the capacitor that is high relative to $V_{CP}$ and a '0' value corresponds to a stored voltage in the capacitor that is low relative to $V_{CP}$. In a binary configuration, the CAM cell stores a binary bit of digital information as '0' on the first storage device C1 and '1' on the second storage device C2, or '1' on the first storage device C1 and '0' on the second storage device C2. Furthermore, in a ternary configuration the CAM cell 100 attains an additional "don't care" state when both storage devices C1, C2 store a '0' in both capacitors. These storage devices C1, C2 are fabricated as part of the integrated circuit implementation of the entire CAM cell array.

For the CAM cell 100 shown in FIG. 2, a number of voltage terminals are used to supply different voltage levels to different parts of the cell 100. The voltage terminals are (1) a higher voltage power supply terminal $V_{DD}$, (2) a lower voltage, e.g., ground terminal $V_{SS}$, (3) a cell plate voltage terminal $V_{CP}$ having a voltage level lying between $V_{DD}$ and $V_{SS}$, (4) a low voltage terminal Vg having a voltage level lying between $VD_{DD}$, and $V_{SS}$. Typical values of $V_{DD}$, $V_{CP}$, and $V_{SS}$ are 3.3 V, 1.65 V and 0 V respectively.

In one embodiment of the invention, the discharge line DL is coupled directly to the ground terminal $V_{SS}$. In an alternative embodiment, the discharge line DL is coupled indirectly to the ground terminal $V_{SS}$ through a current limiter transistor T7 that has its gate terminal connected to the power supply terminal $V_{DD}$. This transistor T7, which is connected to the discharge line, acts to limit the current flowing to ground from all CAM cells where a mismatch exists.

The first and second storage devices C1, C2 have first and second cell nodes N1, N2, respectively, which carry signal levels corresponding to the data stored in the CAM cell 100, either a '0' or '1'. These two cell nodes N1, N2 are accessible for write and read operations via first and second access transistor(s) T1, T2, respectively. The remaining terminals of the two storage devices C1, C2 are connected to the cell plate voltage terminal $V_{CP}$.

The source terminals of the transistors access T1, T2 are connected to the nodes N1, N2, respectively, whereas their drain terminals are connected to first and second bit lines BL1, BL2, respectively. The first and second access transistors T1, T2 have their gate terminals connected to first and second word lines WLA, WLB, respectively. Data to be written to the storage devices C1, C2 is placed on the first and second bit lines BL1, BL2 while activating the first and second access transistors T1, T2 through their gate terminals. To activate the first and second access transistors T1, T2, the voltage level is raised on the word lines WLA, WLB, respectively, to a voltage $V_{PP}$ which may be greater than or equal to $V_{DD}$. The data stored in storage devices C1, C2 can be read at the first and second bit lines BL1, BL2 by also activating the first and second access transistors T1, T2 through the respective word lines WLA, WLB.

The CAM cell 100 includes a comparing circuit having two pull-down circuits PD1, PD2. The first pull-down circuit PD1 contains third and fourth pull-down transistors T3, T4 connected in series between a match line ML and the discharge line DL. The drain terminal of transistor T3 is connected to the source terminal of transistor T4 as shown in FIG. 2. The third pull-down transistor T3 is responsive to the first cell node N1 by having its gate connected to N1. The gate of transistor T4 is connected to a first search line SL1. Likewise, the second pull-down circuit PD2 contains fifth and sixth pull-down transistors T5, T6 connected between the match line ML and the discharge line DL. The drain terminal of transistor T5 is connected to the source terminal of transistor T6. The gate terminal of transistor T5 is connected to node N2. The gate of transistor T6 is connected to the second search line SL2.

The combination of the first and second pull-down circuits PD1, PD2 provides a comparison between complementary data bits stored in the storage devices C1, C2 and complementary search bits carried on SL1, SL2. The results of such comparison is reflected on the match line ML. For example, the match line ML is discharged by the first or the second pull-down circuit PD1, PD2 if there is a data mismatch (described below in more detail). The order of the series connection of transistors T3 and T4 and of transistors T5 and T6 can be reversed without affecting the comparison operation.

The CAM cell 100 performs write, read and search and compare operations. The CAM cell 100 performs these operations by imposing binary signal levels (high or low) at different points of the circuit. The initial step in a write, read or a search and compare operation is to pre-charge the match line ML to a predetermined level.

Figure 3A:
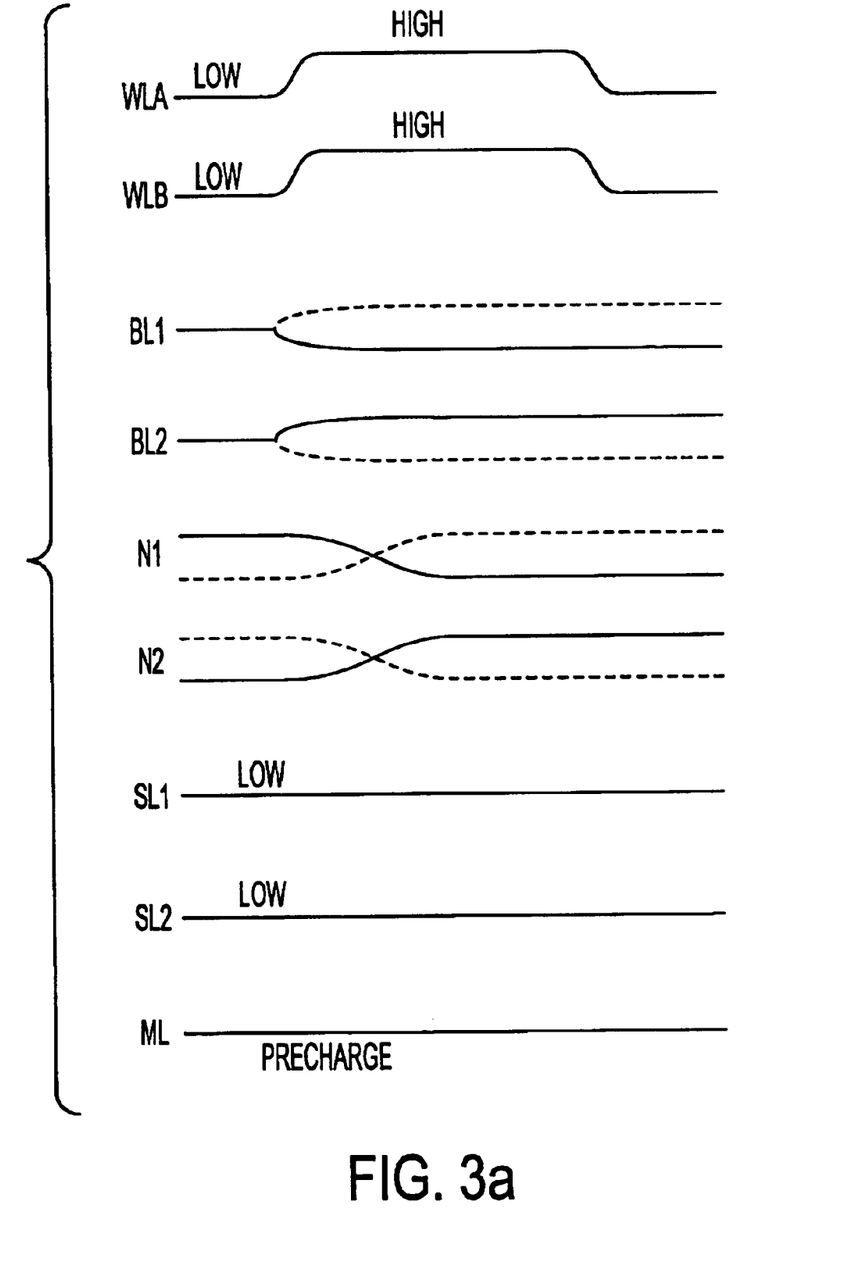
FIGS. 3A, 3B and 3C illustrate the signals and timing of a write sequence for the dynamic CAM cell of FIG. 2.
Figure 3B:
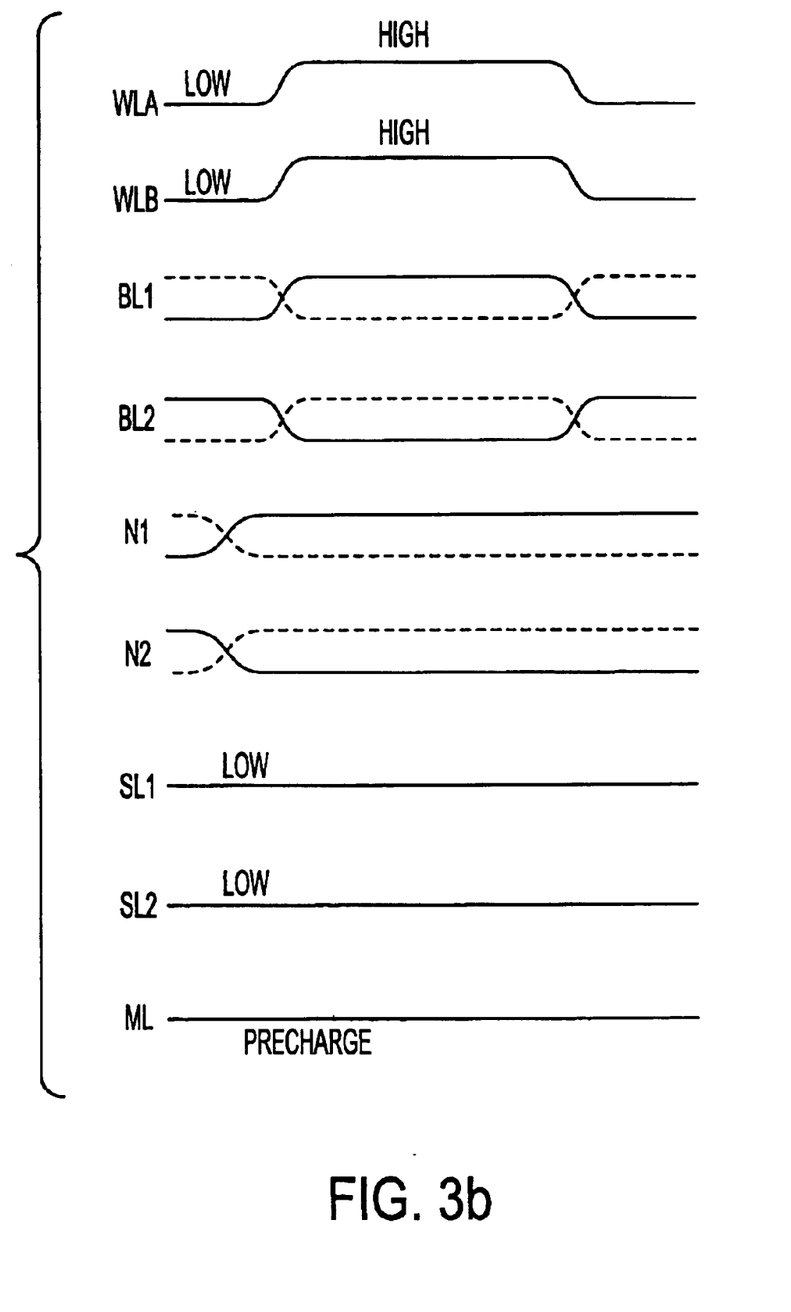
Figure 3C:
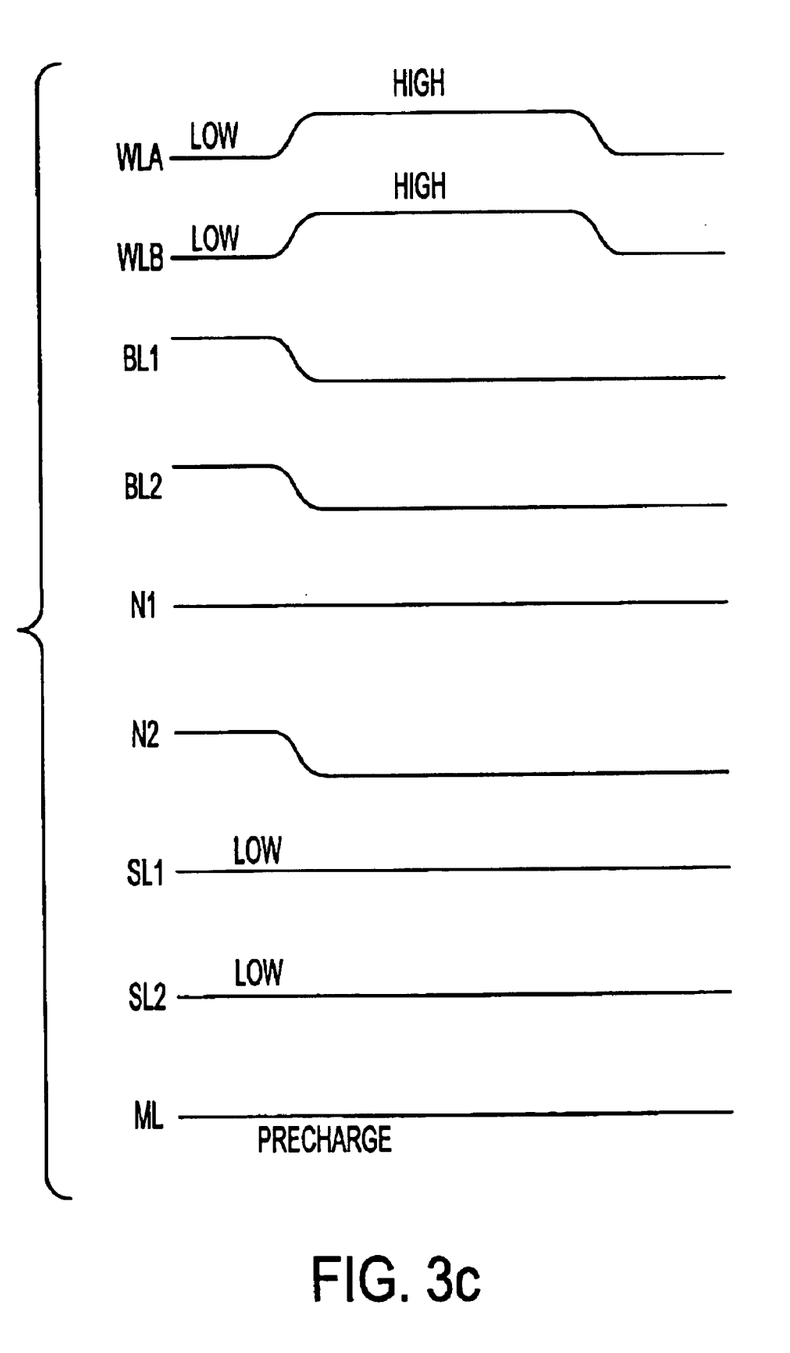

FIGS. 3A, 3B and 3C illustrate three write sequences for the dynamic CAM cell 100 of FIG. 2. As shown in these figures a write sequence consists of the following steps. The match line ML is held at its predetermined level (i.e. pre-charged), while the first and second search lines SL1, SL2 are held at a low level. Binary signal levels (logic high and low) corresponding to data to be written to the CAM cell are placed on the first and second bit lines BL1, BL2. Both word lines WLA, WLB, are raised to $V_{PP}$ level (higher than $V_{DD}$) so that the first storage capacitor C1 is charged causing the first cell node N1 to attain the signal level at BL1 and the second storage capacitor C2 is charged causing the second cell node N2 to attain the signal level on BL2. The signal level at both word lines WLA, WLB are then lowered to $V_{SS}$ and the signal levels attained at the first and second nodes N1, N2 are stored on the first and second capacitors C1, C2 respectively.

The sequences shown in FIGS. 3A and 3B relate to the writing of a binary bit represented by a complementary pair of low (0) and high (1) signals placed on the bit lines BL1, BL2. The solid lines for the bit lines BL1, BL2, and nodes N1, N2 illustrate one complementary pair of signals whereas the dotted lines illustrate another complementary pair opposite to what is shown by the solid lines. FIG. 3A relates to a write sequence beginning with the bit lines BL1, BL2 at an intermediate level which falls between high and low. The intermediate level is typically half $V_{DD}$ relative to $V_{SS}$. FIG. 3B relates to a write sequence beginning with the bit lines BL1, BL2 at other than the intermediate level. This occurs when the write sequence is immediately preceded by a previous write sequence and the bit lines BL1, BL2 did not have sufficient time to return to their intermediate level.

With reference to FIG. 3C, a ternary data write example is illustrated. In this sequence, both bit lines BL1, BL2 carry a '0' which is to be written into the nodes N1, N2 respectively. The steps involved in the ternary data write sequence are the same as those involved with a normal binary write sequence. That is, the match line ML is held at its precharge level, while the first and second search lines SL1, SL2 are held at low level. Low logic level signals '0' are placed on the bit lines BL1, BL2 respectively. Both word lines WLA, WLB are raised to $V_{PP}$ so that the access transistors T1, T2 conduct fully and pass the bit line data onto the nodes N1, N2, respectively. The word lines WLA, WLB are lowered to $V_{SS}$ and the '0' data on nodes N1, N2 is stored on the storage devices C1, C2, respectively.

Since both nodes N1, N2 are logic low or '0', neither one of the pull-down transistors T3, T5 will be enabled. As a result, any search data presented during a search and compare operation to the gates of the pull-down transistors T4, T6 will effectively be ignored and cannot create a path between the match line ML and the discharge line DL. Hence this data '0' stored on both nodes N1, N2 represents the "don't care" state of the CAM cell.

Figure 4:
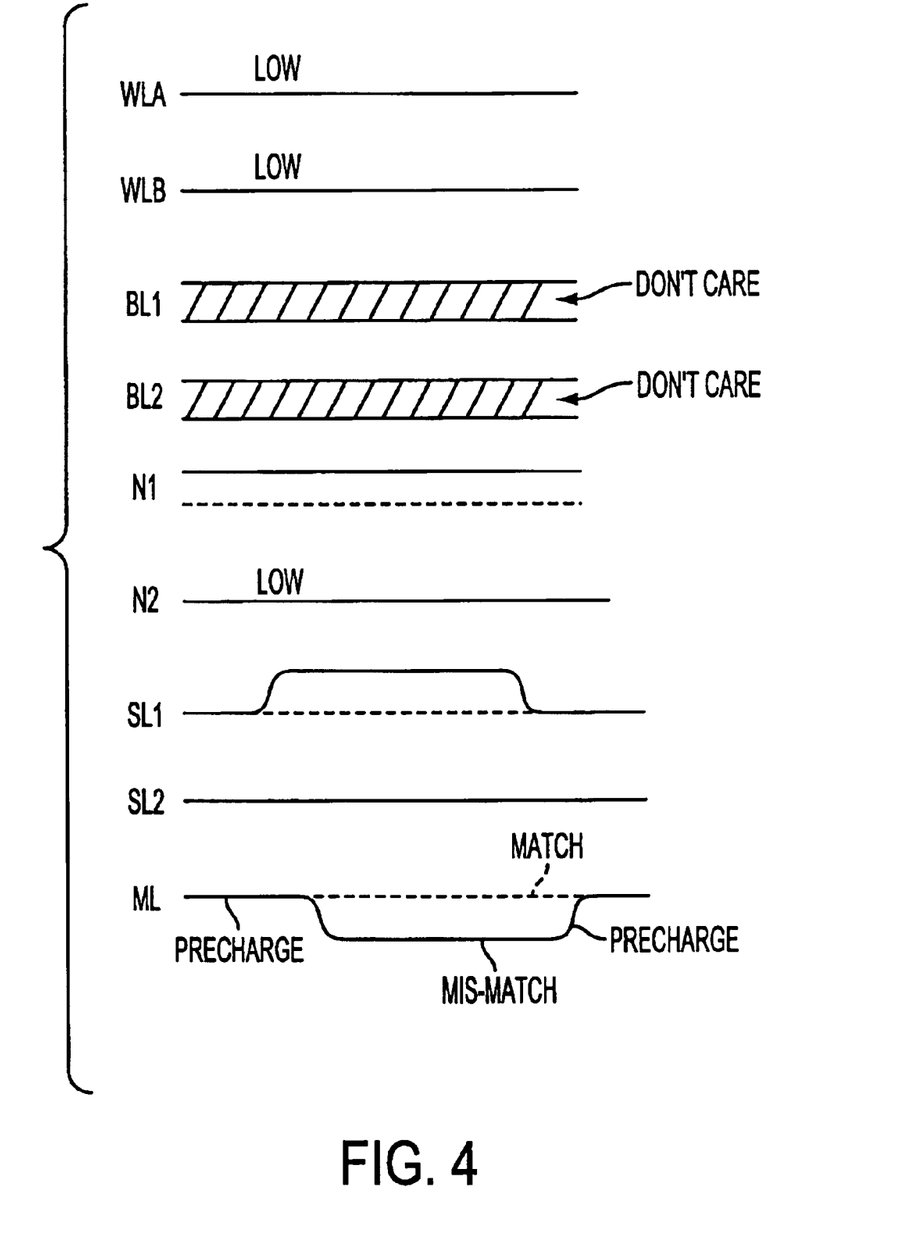
FIG. 4 illustrates signals and timing of a search sequence for the dynamic CAM cell of FIG. 2.

FIGS. 2 and 4 illustrate an exemplary search and compare sequence for the dynamic CAM cell 100. The illustrated sequence comprises the following steps. During the entire search and compare sequence, both word lines WLA, WLB are held at low level, whereas the first and second bit lines BL1, BL2 may be held at their predetermined level or may be driven to '0' or '1'. The bit lines BL1, BL2 may also be floating. The match line ML begins at its predetermined level at $V_{DD}$ or slightly below $V_{DD}$. Binary signal levels corresponding to the search data to be compared with the data stored in the CAM cell 100, are placed on the first and second search lines SL1, SL2. In the illustrated example, SL1='1', SL2='0'.

The result of comparing the search data with the stored data is indicated by the ensuing signal level on the match line ML. If the search data is the same as the stored data, i.e. if there is a match, then the match line ML remains at its precharge level. This occurs because neither of the first or second pull-down circuits PD1, PD2 has its transistors conducting and thus, does not pull the ML down. If the search data is different from the stored data, i.e., if there is a mismatch, then one of the two pull-down circuits PD1, PD2 will be activated since both of its transistors will be conducting, allowing current to flow to the discharge line DL, which pulls down the match line ML to a signal level below its precharged level. For example, if SL1='1' and SL2='0' and N1='1', there would be a mismatch and transistors T3, T4 would conduct, thereby pulling the match line ML away from its precharge level as shown by the dotted line in FIG. 4.

It should be noted that the first and second pull-down circuits PD1, PD2 perform the comparison of the search data carried on the first and second search lines SL1, SL2, with the stored data present at the first and second nodes N1, N2. When there is a match, neither the first nor the second pull-down circuit PD1, PD2 conduct. When there is a mismatch, either of the first or the second pull-down circuit conducts. In FIG. 4, the solid lines relate to the case where the search data match the stored data, whereas the dotted lines relate to the case where the search data mismatch the stored data.

Figure 5A:
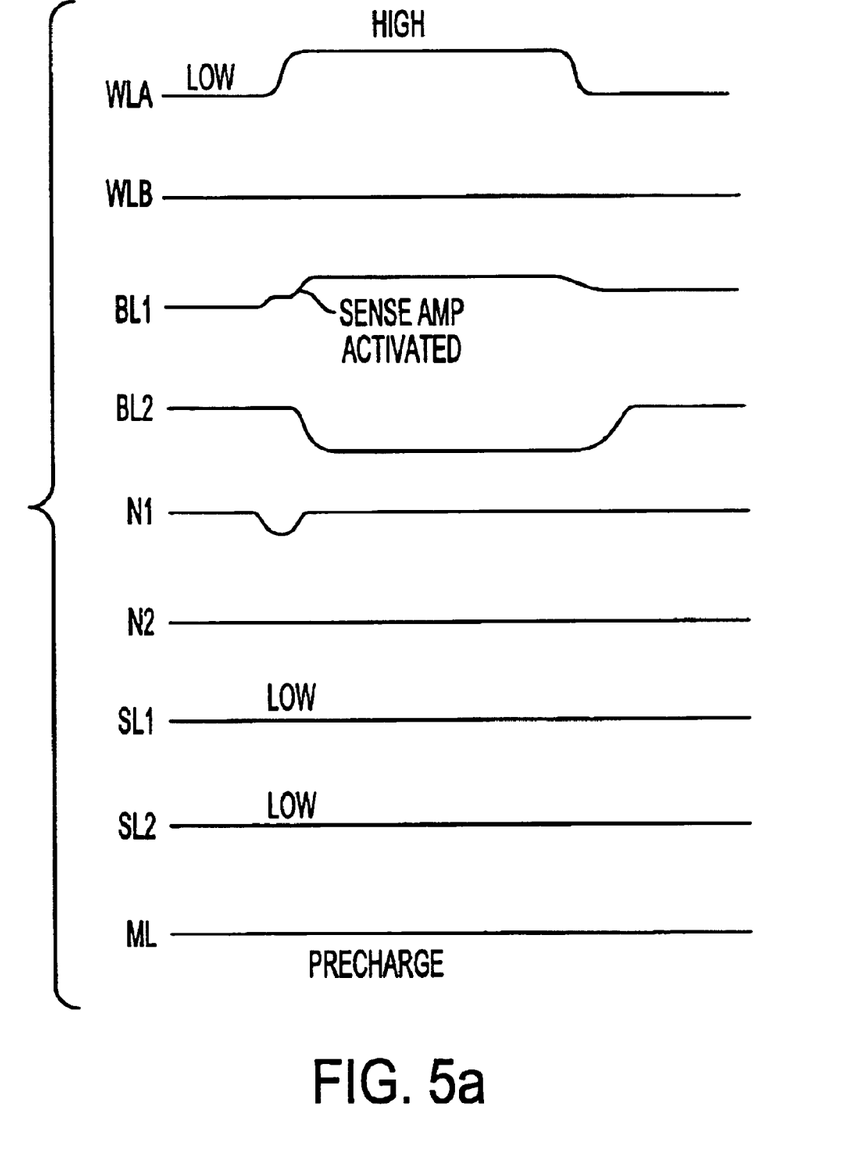
FIGS. 5A and 5B illustrate signals and timing of a read sequence for the dynamic CAM cell of FIG. 2.
Figure 5B:
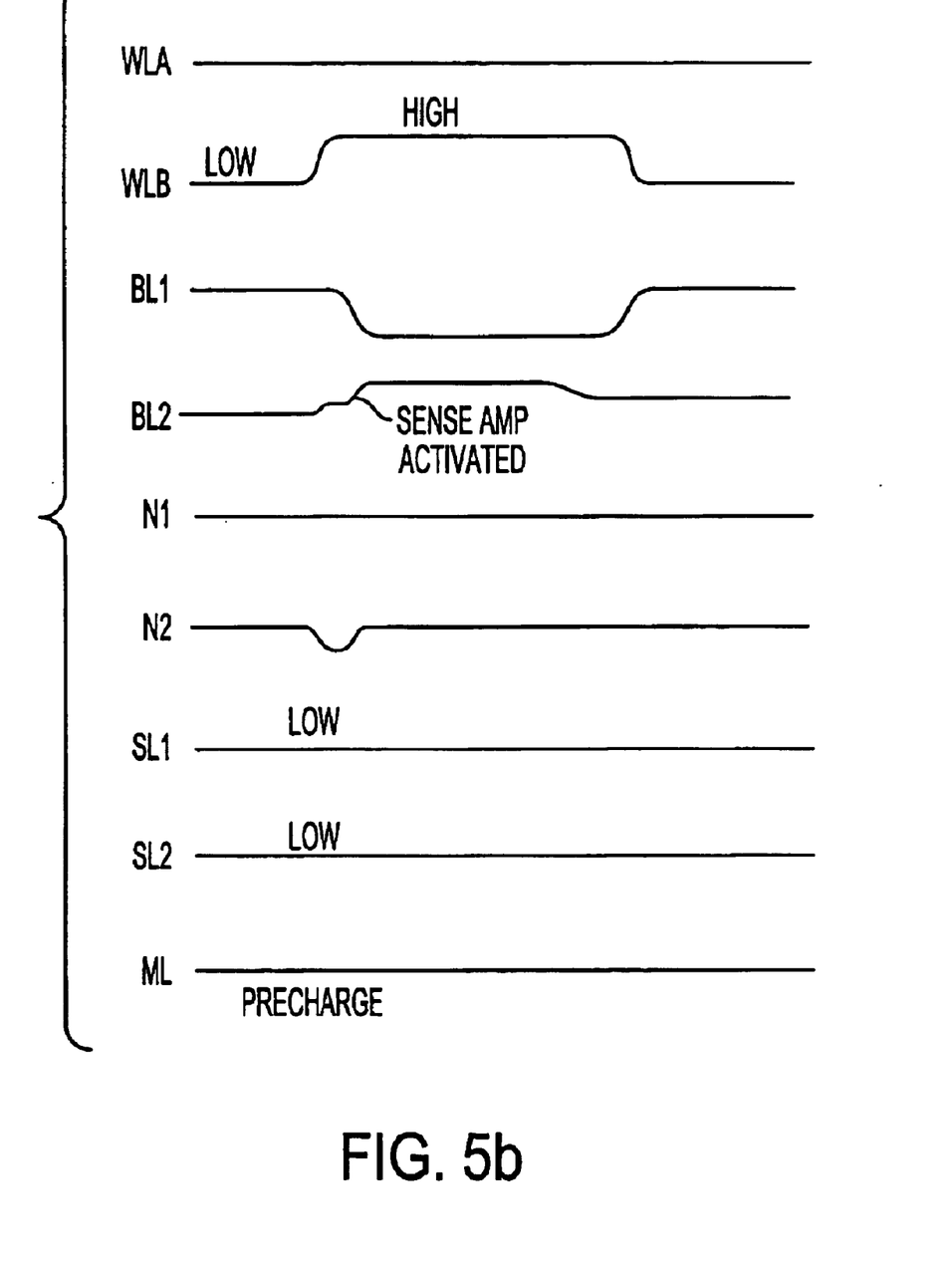

FIGS. 5A and 5B illustrate exemplary read sequences for the dynamic CAM cell 100 of FIG. 2. The read sequences comprise the following steps:

(a) During the entire read sequence, the match line ML is held at its precharge level, whereas the search lines SL1, SL2 are held at a low level.

(b) The bit lines BL1, BL2 are initially precharged to their intermediate level ($V_{DD}/2$).

(c) The first word line WLA is raised to the $V_{PP}$ level to permit charge sharing between the first bit line BL1 and the first capacitor C1 so that voltage levels at the first bit line BL1 begin to deviate from the initial precharge level to track the data stored in the first capacitor C1 (FIG. 5A).

(d) The differences of the deviated signal level at the first bit line BL1 from its precharge level are sensed and amplified by a bit line sense amplifier SA (FIG. 2) to provide an output of the read sequence.

(e) The voltage level of the bit lines BL1, BL2 are equalized with each other to a precharged level.

(f) The amplified output of the read sequence is used to restore the data originally stored in the CAM cell by recharging the first capacitor C1 to its state just prior to the read sequence.

(g) The second word line WLB is raised to the $V_{PP}$ level to permit charge sharing between the second bit line BL2 and the second capacitor C2 so that voltage levels at the second bit line BL2 begin to deviate from the initial precharge level to track the data stored in the second capacitor C2 (FIG. 5B).

(h) The differences of the deviated signal level at the second bit line BL2 from its precharge level are sensed and amplified by the same bit line sense amplifier SA (FIG. 2) to provide an output of the read sequence.

(i) The amplified output of the read sequence is used to restore the data originally stored in the CAM cell by recharging the second capacitor C2 to its state just prior to the read sequence.

It is important to note that unlike the prior art circuits, the embodiment of the present invention described above has a folded bit line architecture and a split word line scheme. A folded bit line architecture comprises an array of CAM cells including differential sense amplifiers each connected to two different rows of memory cells, wherein the two rows of memory cells connected to a specific sense amplifier lie adjacent and parallel to each other on the same side of the sense amplifier. Furthermore, the present invention reduces the amount of sense amplifiers by at least one-half the count over the prior art.

Figure 6:
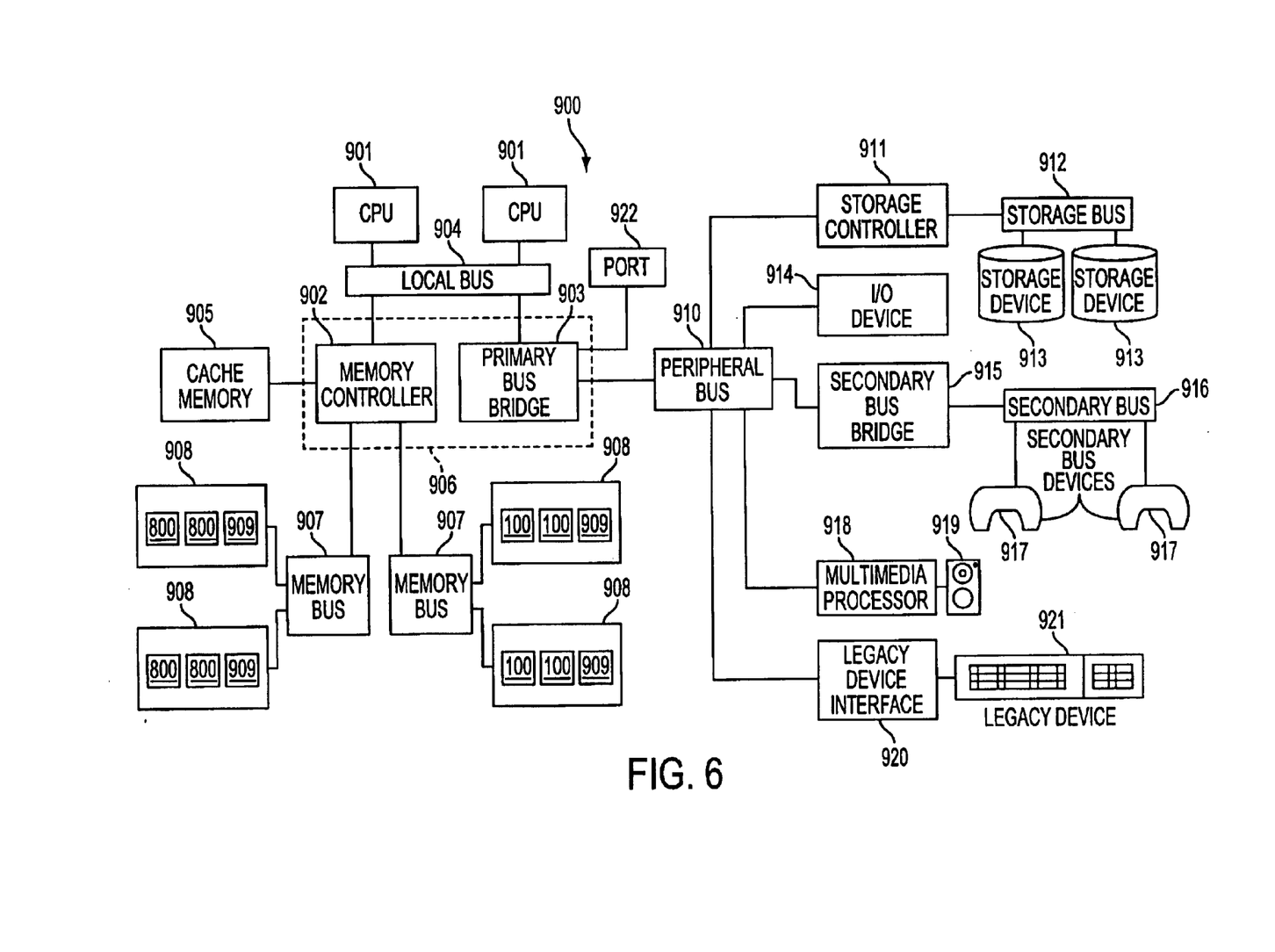
FIG. 6 is a block diagram illustrating a processor system utilizing a CAM constructed in accordance with an embodiment of the invention.

FIG. 6 illustrates an exemplary processing system 900 which may utilize a memory device 800 constructed in accordance with an embodiment of the present invention. That is, the memory device 800 may be a CAM device that utilizes the CAM cell 100 illustrated in FIG. 2.

The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 800 of the present invention. The memory components 908 may be a memory card or a memory module. The memory components 908 may include one or more additional devices 909. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 800. These electronic devices may include, but are not limited to audio/video processors and recorders, gaming consoles, digital television sets, wired or wireless telephones, navigation devices (including system based on the global positioning system (GPS) and/or inertial navigation), network routers or switches, and digital cameras and/or recorders. The modifications may include, for example, elimination of unnecessary components, addition of specialized devices or circuits, and/or integration of a plurality of devices.

Figure 7:
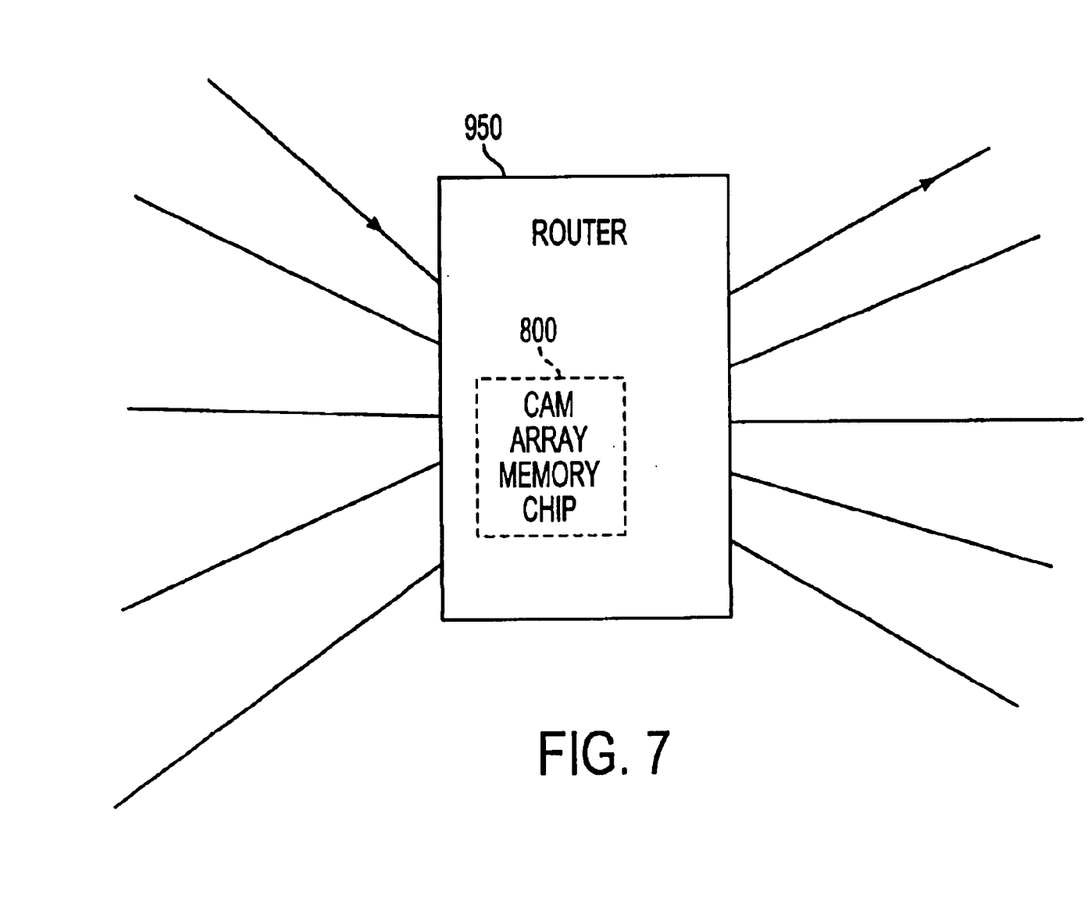
FIG. 7 is a block diagram illustrating a network router utilizing a CAM constructed in accordance with an embodiment of the invention.

FIG. 7 is a simplified block diagram of a router 950 as may be used in a communications network, such as, e.g., part of the Internet backbone. The router 950 contains a plurality of input lines and a plurality of output lines. When data is transmitted from one location to another, it is sent in a form known as a packet. Oftentimes, prior to the packet reaching its final destination, that packet is first received by a router, or some other device. The router 950 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 950, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 7, router 950 contains the added benefit of employing a semiconductor memory chip containing a CAM device 800, such as the CAM devices constructed and operated in accordance with FIGS. 2–5.

Although the invention has been described with reference to using storage devices which are dynamic, e.g. capacitors, the invention has equal applicability using static storage devices, such as flip flops or other static memory elements or devices.

The above description and accompanying drawings are only illustrative of exemplary embodiments, which can achieve the features and advantages of the present invention. It is not intended that the invention be limited to the embodiments shown and described in detail herein. The invention can also be modified to incorporate any number of variations, alterations, substitutions or equivalent arrangements not heretofore described, but which are commensurate with the spirit and scope of the invention. Accordingly, the invention is only limited by the scope of the following claims.

What is claimed is:

1. A content addressable memory cell for storing and accessing ternary data, comprising:
   a first storage device for storing a first data bit;
   a second storage device for storing a second data bit;
   first and second access devices respectively coupling said first and second storage devices to first and second bit lines;
   first and second word lines respectively connected to control said first and second access devices, said word lines allowing the first and second storage devices to be independently respectively coupled to said first and second bit lines.

2. The content addressable memory cell of claim 1, further comprising a comparator connected to said first and second storage devices and to first and second search lines, said comparator comparing first and second search bits carried on the first and second search lines to the first and second data bits and reporting a result of the comparison.

3. The content addressable memory cell of claim 1, wherein said comparator couples a match line to a discharge line if the first and second search bits do not match the first and second data bits, and when the first and second data bits have complementary values.

4. The content addressable memory cell of claim 3, wherein the discharge line is selectively coupled to a low voltage terminal, having a predetermined voltage level between that of a power supply terminal and a ground terminal.

5. The content addressable memory cell of claim 3, wherein the discharge line is coupled to a ground terminal through a current limiter.

6. The content addressable memory cell of claim 5, wherein the current limiter comprises a transistor.

7. The content addressable memory cell of claim 1, wherein said storage devices have first and second storage states where the first and second data bits are complements of each other and a third storage state where the first and second data bits have the same value.

8. The content addressable memory cell of claim 1, wherein each of said first and second storage devices comprise a capacitor.

9. The content addressable memory cell of claim 1, wherein said comparator comprises first and second pull-down circuits, said first and second pull-down circuits reporting the result by pulling down a match line where said comparator couples a match line to a discharge line if the first and second search bits do not match the first and second data bits, and when the first and second data bits have complementary values.

10. The content addressable memory cell of claim 9, wherein said first pull-down circuit includes a first pair of transistors in series having gates thereof, respectively coupled to the first storage device and the second search line, and the second pull-down circuit includes a second pair of transistors in series having gates thereof respectively coupled to the second storage device and the first search line.

11. The content addressable memory cell of claim 1, wherein the first and second bit lines are configured as folded bit lines.

12. The content addressable memory cell as defined in claim 1, wherein the first and second access devices each include a transistor having a gate respectively coupled to the first and second word lines.

13. The content addressable memory cell as defined in claim 1, wherein the bit lines of said CAM cell are coupled to respective inputs of the same sense amplifier.

14. The of claim 13, wherein said sense amplifier is a differential sense amplifier.

15. The content addressable memory cell of claim 1, wherein the memory is a dynamic content addressable memory.

16. A content addressable memory device for storing and accessing ternary data, comprising:
   at least one memory cell comprising:
     a first storage device for storing a first data bit;
     a second storage device for storing a second data bit;
     first and second access devices respectively coupling said first and second storage devices to first and second bit lines,
     a comparator for comparing the content of said storage devices to data on a pair of search lines and reporting the comparison results; and
     a sense amplifier having a pair of inputs respectively connectable to said first and second bit lines.

17. The content addressable memory device as defined in claim 16, further comprising first and second word lines for respectively controlling said first and second access devices, said word lines allowing the first and second storage devices to be independently accessed.

18. The content addressable memory cell of claim 16, wherein the memory is a dynamic content addressable memory.

19. The of claim 16, wherein said sense amplifier is a differential sense amplifier.

20. A content addressable memory cell for storing and accessing ternary data, comprising:
   a first storage device for storing a first data bit;
   a second storage device for storing a second data bit;
   said first and second storage devices being connected to a comparator, said comparator being connected to first and second search lines, said comparator comparing first and second search bits carried on the first and second search lines to first and second bits stored in said storage devices and reporting the result of the comparison; and
   first and second word lines respectively connected to control said first and second access devices, said word lines allowing first and second storage devices to be independently coupled to respective bit lines.

21. The content addressable memory cell of claim 20, wherein said comparator couples a match line to a discharge line if the first and second search bits do not match the first and second data bits, and when the first and second data bits have complementary values.

22. The content addressable memory cell of claim 20, wherein said comparator comprises first and second pull-down circuits, said first and second pull-down circuits reporting the result by pulling down a match line where said comparator couples a match line to a discharge line if the first and second search bits do not match the first and second data bits, and when the first and second data bits have complementary values.

23. The content addressable memory cell of claim 22, wherein said first pull-down circuit includes a first pair of transistors in series having gates thereof, respectively coupled to the first storage device and the second search line, and the second pull-down circuit includes a second pair of transistors in series having gates thereof respectively coupled to the second storage device and the first search line.

24. The content addressable memory cell of claim 20, wherein the memory is a dynamic content addressable memory.

25. A dynamic content addressable memory cell for storing and accessing ternary data, comprising:
   a first storage device for storing a first data bit;
   a second storage device for storing a second data bit;
   a comparator connected to first and second search lines and said first and second storage devices, said comparator comparing first and second search bits carried on first and second search lines to the first and second bits from said first and second storage devices and reporting the result of the comparison;

first and second word lines respectively connected to control first and second access devices, said word lines allowing the first and second data bits to be independently written to and read from respective bit lines.

26. A processor system comprising:
a processor; and
a memory device for exchanging data with said processor, said memory device having a CAM cell structure comprising:
a first storage device for storing a first data bit;
a second storage device for storing a second data bit;
first and second access devices respectively coupling said first and second storage devices to first and second bit lines;
first and second word lines, respectively, connected to control said first and second access devices, said word lines allowing the first and second storage devices to be independently respectively coupled to said first and second bit lines.

27. The processor system of claim 26, comprising of a comparator connected to said first and second storage devices and to first and second search lines, said comparator comparing first and second search bits carried on the first and second search lines to the first and second data bits and reporting a result of the comparison.

28. The processor system of claim 26, wherein said comparator couples a match line to a discharge line if the first and second search bits do not match the first and second data bits, and when the first and second data bits have complementary values.

29. A processor system of claim 26, where said storage devices have first and second storage states where the first and second data bits are complement of each other and third storage state where the first and second data bits have the same value.

30. The processor system of claim 29, wherein each of the first and second storage devices include a capacitor.

31. The processor system of claim 29, wherein the discharge line is selectively coupled to a low voltage terminal, having a predetermined voltage level between that of a power supply terminal and a ground terminal.

32. The processor system of claim 31, wherein the first and second access devices each include a transistor having a gate coupled to the first and second word lines.

33. The processor system of claim 29, wherein the first and second bit lines are folded bit lines.

34. The processor system of claim 29, wherein the current limiter comprises a transistor.

35. The processor system of claim 29, further comprising:
first and second access means for coupling said first and second storage devices to the first and second bit lines respectively when said first and second access means are activated by a first and second word lines respectively.

36. The processor system of claim 26, wherein said first and second data bits having a value independent of the other.

37. The processor system of claim 26, wherein said data bits comprise first and second pull-down circuits, said first and second pull-down circuits reporting the result by pulling down a match line when said comparator couples a match line to a discharge line if the first and second system bits do not match the first and second data bits, and when the first and second data bits have complementary values.

38. A processor system of claim 37, wherein said first pull-down circuit includes a first pair of transistors in series having gates thereof, respectively coupled to the first storage device and the second search line, and the second pull-down circuit includes a second pair of transistors in series having gates thereof respectively coupled to the second storage device and the first search line.

39. The processor system of claim 37, wherein the discharge line is coupled to a ground terminal through a current limiter.

40. A processor system comprising:
a processor; and
a memory device for exchanging data with said processor, said memory device having a CAM cell structure comprising:
at least one memory cell comprising:
a first storage device for storing a first data bit;
a second storage device for storing a second data bit;
first and second access devices respectively independently coupling said first and second storage devices to first and second bit lines,
a comparator for comparing the content of said storage devices to data on a pair of search lines and reporting the comparison result; and
a sense amplifier having a pair of inputs respectively connectable to said first and second bit lines.

41. The of claim 40, wherein said sense amplifier is a differential sense amplifier.

42. A processor system comprising:
a processor; and
a memory device for exchanging data with said processor, said memory device having a CAM cell structure comprising:
a first storage device for storing a first data bit;
a second storage device for storing a second data bit;
said first and second storage devices being connected to a comparator, said comparator being connected to first and second search lines, said comparator comparing first and second search bits carried on the first and second search lines to first and second bits stored in said storage devices and reporting the result of the comparison; and
first and second word lines respectively connected to control first and second access devices, said word lines allowing the first and second storage devices to be independently accessed from respective bit lines.

43. A processor system comprising:
a processor; and
a memory device for exchanging data with said processor, said memory device having a CAM cell structure comprising:
a first storage device for storing a first data bit;
a second storage device for storing a second data bit;
a comparator connected to first and second search lines and said first and second storage means, said comparator comparing first and second search bits carried on first and second search lines to the first and second bits from said first and second storage devices and reporting the result of the comparison;
first and second word lines respectively connected to control first and second access devices, said word lines allowing the first and second data bits to be independently written to and read from respective bit lines.

44. A router system comprising:
a CAM array for storing routing information, said CAM array have a plurality of said CAM cells, each of said cells comprising:

a first storage device for storing a first data bit;

a second storage device for storing a second data bit;

first and second access devices coupling said first and second storage devices to said first and second bit lines;

first and second bit lines respectively connected to said first and second storage devices;

first and second word lines respectively connected to control said first and second access devices, said word lines allowing the first and second storage devices to be independently respectively coupled to said first and second bit lines.

45. The router system of claim 44, comprising of a comparator connected to said first and second storage devices and to first and second search lines, said comparator comparing first and second search bits, carried on the first and second search lines to the first and second data bits.

46. The router system of claim 44, wherein said comparator couples a match line to a discharge line if the first and second search bits do not match the first and second data bits, and when the first and second data bits have complementary values.

47. A router system of claim 44, wherein said storage devices have first and second storage states, where the first and second data bits are complements of each other and a third storage state where the first and second data bits have the same value.

48. The router system of claim 44, wherein the first and second data bits having a value independent of the other.

49. A router system of claim 44, wherein each of the first and second storage devices include a capacitor.

50. The router system of claim 44, wherein said comparator comprises first and second pull-down circuits, said first and second pull-down circuits reporting the result by pulling down a match line where said comparator couples a match line to a discharge line if the first and second search bits do not match the first and second data bits, and when the first and second data bits have complementary values.

51. The router system of claim 50, wherein the first pull-down circuit includes a first pair of transistors in series having gates thereof, respectively coupled to the first storage device and the second search line, and the second pull-down circuit includes a second pair of transistors in series having gates thereof respectively coupled to the second storage device and the first search line.

52. The router system of claim 50, wherein the discharge line is selectively coupled to a low voltage terminal, having a predetermined voltage level between that of a power supply terminal and a ground terminal.

53. The router system of claim 44, wherein the first and second bit lines are folded bit lines.

54. The router system of claim 44, wherein the discharge line is coupled to a ground terminal through a current limiter.

55. The router system of claim 54, wherein the current limiter comprises a transistor.

56. The router system of claim 54, further including:
first and second access means for coupling said first and second storage devices to the first and second bit lines respectively when said first and second access means are activated by a first and second word lines respectively.

57. The router system of claim 56, wherein the first and second access devices each include a transistor having a gate coupled to the first and second word lines.

58. A method of operating a content addressable memory cell, comprising the steps of:
respectively placing first and second bit data on first and second bit lines, independently storing the first and second bit data on the bit lines in respective first and second storage devices in response to respective access signals; and comparing the stored first and second data bits to respective bits on first and second search lines and indicating the result of the comparison.

59. The method as in claim 58, wherein the memory is a dynamic content addressable memory.

60. The method as in claim 58 wherein said first and second data bits have complementary data values.

61. The method as in claim 58 wherein said first and second data bits have the same data value.

62. A method of comparing search data with stored data in a content addressable memory cell comprising the steps of:
precharging a match line to a predetermined precharge voltage level, the match line being coupled to the dynamic content addressable memory cell having first and second storage devices;

comparing two data bit values from first and second storage devices to a respective pair of search data bits and indicating a data mismatch by changing the voltage level of said match line;

detecting a voltage on the match line as an indication of an outcome of the comparison between the search data and the stored data; and independently accessing said first and second storage devices through respective bit lines and associated access devices.

63. The method as in claim 62, wherein the memory is a dynamic content addressable memory.

64. The method as in claim 62 further comprising reading out the data bits stored in said storage devices into a common sense amplifier.

65. The of claim 64, wherein said sense amplifier is a differential sense amplifier.

66. The method as in claim 62 wherein said first and second data bits have complementary data values.

67. The method as in claim 62 wherein said first and second data bits have the same data value.

* * * * *